United States Patent [19]
McCoy et al.

[11] Patent Number: 5,197,185
[45] Date of Patent: Mar. 30, 1993

[54] PROCESS OF FORMING ELECTRICAL CONNECTIONS BETWEEN CONDUCTIVE LAYERS USING THERMOSONIC WIRE BONDED BUMP VIAS AND THICK FILM TECHNIQUES

[75] Inventors: Dirk D. McCoy, Batavia; Scott W. Johansen, Barrington, both of Ill.

[73] Assignee: AG Communication Systems Corporation, Phoenix, Ariz.

[21] Appl. No.: 794,097

[22] Filed: Nov. 18, 1991

[51] Int. Cl.⁵ .......................... H05K 3/40; H05K 3/46
[52] U.S. Cl. ......................................... 29/848; 29/846
[58] Field of Search ............... 437/183, 195, 204, 245, 437/228, 944, 187, 235, 243; 148/DIG. 100; 29/846, 848

[56] References Cited

FOREIGN PATENT DOCUMENTS

| 57-28950 | 6/1982 | Japan | 437/195 |
| 59-67652 | 4/1984 | Japan | 437/183 |
| 63-245942 | 10/1988 | Japan | 437/183 |
| 1-112741 | 5/1989 | Japan | 437/183 |
| 1-199452 | 8/1989 | Japan | 437/195 |

Primary Examiner—Olik Chaudhuri
Assistant Examiner—David E. Graybill
Attorney, Agent, or Firm—Anthony J. Baca

[57] ABSTRACT

The process of the present invention allows interconnecting one conductive layer to another in a Multichip Module. The process uses bumps formed by wire bonding, or any other means of forming bumps of 0.002"–0.004" height with comparable diameter. These bumps create an opening through dielectric insulating layers, thereby allowing one conductive layer to be electrically connected to the next conductive layer.

10 Claims, 1 Drawing Sheet

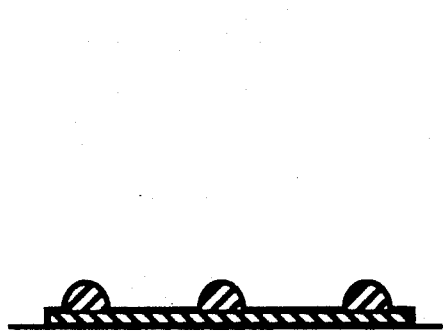
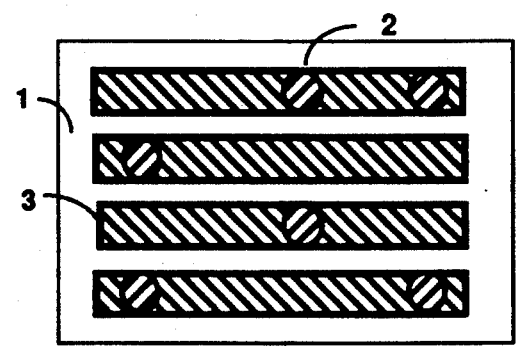
FIGURE 1A  FIGURE 1B
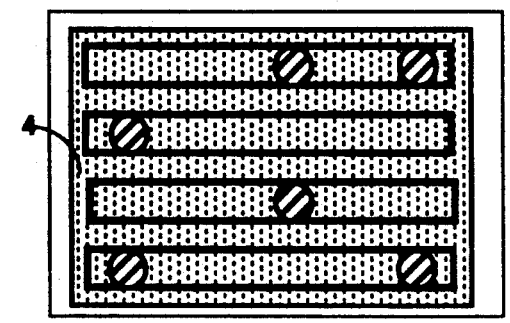
FIGURE 2A  FIGURE 2B
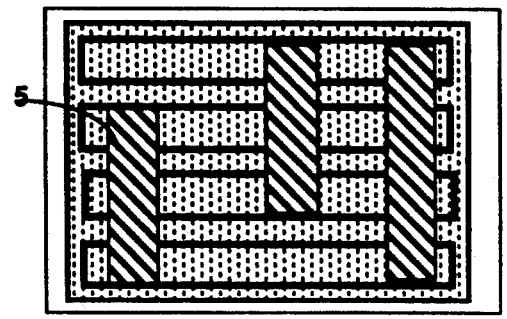
FIGURE 3A  FIGURE 3B

PROCESS OF FORMING ELECTRICAL CONNECTIONS BETWEEN CONDUCTIVE LAYERS USING THERMOSONIC WIRE BONDED BUMP VIAS AND THICK FILM TECHNIQUES

FIELD OF THE INVENTION

The present invention relates to a process used to manufacture high density interconnect substrates. These substrates are used in a variety of electronic applications, including telecommunications, automotive and industrial controls, military electronics, and computers and business equipment.

BACKGROUND OF THE INVENTION

Vias are used to interconnected different layers of Multichip Modules (MCM). Numerous processes have been used to manufacture high density interconnect vias. These vias are critical in the manufacture of MCM, which is a growing packaging technology in the electronic field.

Prior to the present invention, to form vias with a thick film additive process, screen printing is used. A dielectric ink is screen printed onto the substrate with openings for the vias. The dielectric ink is fired at high temperatures, and a conductive ink is used to fill the vias before subsequent layers are added. However, the rheology of the dielectric ink is such that its flow causes small via openings of less than 0.008" to close.

Photo-imaging and "diffusion patterning" processes have been developed to address this problem, but these are both subtractive processes, i.e., material must be washed away. This creates a need for expensive capital equipment for the imaging, developing, etching, and dealing with waste created. Additionally, neither process has been used in production on a large scale.

High density interconnects can be formed using thin film sputtering and chemical vapor deposition processes, but these too require capital equipment costing from hundreds of thousands to millions of dollars. Also, thin film processes are unproven in the creation of thick dielectrics needed for reliability.

Therefore it is the objective of the present invention to provide an economical, safe, and reliable means of interconnecting layers on an MCM.

SUMMARY OF THE INVENTION

In order to accomplish the object of the present invention there is provided a method of electrically connecting a first conductive layer with a second conductive layer. First, the first conductive layer is formed on the substrate. Next, conductive bumps are bonded to the first conductive layer, the conductive bumps having a height between 0.002" and 0.004". The first conductive layer is coated with a nonconductive layer, the nonconductive layer having a thickness less than the height of the conductive bumps. Finally, the second conductive layer is deposited over the nonconductive layer making electrical contact with the conductive bumps thereby electrically connecting the second conductive layer to the first conductive layer.

DESCRIPTION OF THE DRAWINGS

A better understanding of the invention may be had from the consideration of the following detailed description taken in conjunction with the accompanying drawings, in which:

FIGS. 1A and 1B show simplified diagrams of the first step of the present invention.

FIGS. 2A and 2B show simplified diagrams of the second step of the present invention.

FIGS. 3A and 3B show simplified diagrams of results of using the present invention.

DESCRIPTION OF THE PREFERRED EMBODIMENT

The process of the present invention allows interconnecting one conductive layer to another in a Multichip Module. The process uses bumps formed by wire bonding, or any other means of forming bumps of 0.002"-0.004" height with comparable diameter. These bumps create an opening through dielectric insulating layers, thereby allowing one conductive layer to be electrically connected to the next conductive layer.

Referring to FIGS. 1, 2 and 3. Note: FIGS. 1, 2, and 3, are meant to only show the process of the present invention; the end product, as shown in FIG. 3, is not intended to implement any particular function. The method of forming small vias is accomplished as follows:

First, the bottom conductive layer 3 is deposited onto the substrate material 1. The material used for the first conductor is not critical and may be gold, copper, nickel, or other air-firable thick film cermet. The deposition process also is not critical and may be thick film, thin film, or plating. Depending on the deposition process, the substrate 1 and first conductive layer 3 may need to be fired to cure the cermet.

Next, a thermosonic wire bonder is used to create 0.002" to 0.004" ball "bumps" 2 on the first layer. The bumps are formed on pads that are to be routed up to the next layer. The process of thermosonic wire bonding is known in the art.

A dielectric thick film paste is next deposited on top of the first conductive layer either through screen, flow coating, or other means. If screen printing is used it should have a combination of direct and indirect emulsions to prevent the bumps 2 from being coated. The deposited coating is 0.002"-0.003" in height in the wet stage, 0.0003"-0.0007" below the height of the bumps. The coating flows until it surrounds the bumps. This is then fired to create a dense insulating film 4, with the bumps 2 providing a conductive path to the first conductive layer 3 through the insulting film 4.

Finally, the second conductive layer 5 is deposited over the dense insulating film 4 using either thin or thick film processing. Thus the second conductive layer 5 is electrically connected to the first conductive layer 3 through the bumps 2.

The previous steps may be repeated depending on the number of conductor layers required.

To summarize, first a conductive layer is deposited. Next conductive bumps are formed on the first conductive layer. Over the conductive layer a nonconductive layer with a thickness substantially equal to, but slightly less than, the heights of the conductive bumps is applied. Another conductive layer can be deposited over the nonconductive layer, making electrical contact to the lower layer through the exposed bumps. This process may be repeated as needed.

Although the preferred embodiment of the invention has been illustrated, and that form described, it is readily apparent to those skilled in the art that various modifications may be made therein without departing from the spirit of the invention or from the scope of the appended claims.

What is claimed is:

1. A method of electrically connecting a first conductive layer with a second conductive layer using a thick film technique, said first conductive layer being on a substrate, said method comprising the steps of:
   forming said first conductive layer on said substrate;
   bonding conductive bumps to said first conductive layer, said conductive bumps having a height, said step of bonding being accomplished by use of a thermosonic wire bonder;
   coating said first conductive layer with a nonconductive layer, said nonconductive layer having a thickness less than said height of said conductive bumps, said nonconductive layer coating around said conductive bumps; and
   depositing said second conductive layer over said nonconductive layer, said second conductive layer making electrical contact with said conductive bumps thereby electrically connecting said second conductive layer to said first conductive layer.

2. A method of electrically connecting a first conductive layer with a second conductive layer as claimed in claim 1, wherein said step of forming being accomplished by screen printing said first conductive layer onto said substrate.

3. A method of electrically connecting a first conductive layer with a second conductive layer as claimed in claim 1, wherein said step of coating being accomplished by screen printing said nonconductive layer onto said first conductive layer.

4. A method of electrically connecting a first conductive layer with a second conductive layer as claimed in claim 1, wherein said step of depositing being accomplished by screen printing said second conductive layer onto said nonconductive layer.

5. A method of electrically connecting a first conductive layer with a second conductive layer as claimed in claim 1, wherein said height of said conductive bumps being between 0.002 and 0.004 inches.

6. A method of electrically connecting a first conductive layer with a second conductive layer as claimed in claim 1, wherein said conductive bumps being formed from a gold wire.

7. A method of electrically connecting a first conductive layer with a second conductive layer, said first conductive layer being on a substrate, said method comprising the steps of:
   first screen printing said first conductive layer on said substrate;
   bonding conductive bumps to said first conductive layer, said conductive bumps having a height, said step of bonding being accomplished by use of a thermosonic wire bonder;
   second screen printing said first conductive layer with a nonconductive layer, said nonconductive layer having a thickness less than said height of said conductive bumps; and
   third screen printing said second conductive layer over said nonconductive layer, said second conductive layer making electrical contact with said conductive bumps thereby electrically connecting said second conductive layer to said first conductive layer.

8. A method of electrically connecting a first conductive layer with a second conductive layer as claimed in claim 7, wherein said height of said conductive bumps being between 0.002 and 0.004 inches.

9. A method of electrically connecting a first conductive layer with a second conductive layer as claimed in claim 7, wherein said conductive bumps being formed from a gold wire.

10. A method of electrically connecting a first conductive layer with a second conductive layer using a thick film technique, said method comprising the steps of:
   forming said first conductive layer;
   bonding conductive bumps to said first conductive layer, said conductive bumps having a height, said step of bonding being accomplished by use of a thermosonic wire bonder;
   coating said first conductive layer with a nonconductive layer, said nonconductive layer having a thickness less than said height of said conductive bumps; and
   depositing said second conductive layer over said nonconductive layer, said second conductive layer making electrical contact with said conductive bumps thereby electrically connecting said second conductive layer to said first conductive layer.

* * * * *